United States Patent
Tao et al.

(10) Patent No.: US 8,023,296 B2
(45) Date of Patent: Sep. 20, 2011

(54) HIGH VOLTAGE, HIGH SPEED, HIGH PULSE REPETITION RATE PULSE GENERATOR

(75) Inventors: Fengfeng Tao, Clifton Park, NY (US); Frank Jakob John Mueller, Glenville, NY (US); Robert Carl Murray, Rotterdam, NY (US); Abdelkrim Younsi, Ballston Lake, NY (US); Seyed Gholamali Saddoughi, Clifton Park, NY (US); Joseph Taher Mossoba, Niskayuna, NY (US); John Stanley Glaser, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 491 days.

(21) Appl. No.: 11/899,645

(22) Filed: Sep. 6, 2007

(65) Prior Publication Data
US 2009/0066391 A1    Mar. 12, 2009

(51) Int. Cl.
*H02M 7/537* (2006.01)
(52) U.S. Cl. ........ 363/131; 363/21.03; 363/65; 363/124
(58) Field of Classification Search .................. 323/266; 363/21.02, 21.03, 56.01, 65, 73, 124, 131, 363/1, 13, 123, 132, 178, 8; 327/124, 291
See application file for complete search history.

(56) References Cited

U.S. PATENT DOCUMENTS

| | | | | |
|---|---|---|---|---|
| 3,582,756 A * | 6/1971 | McMurray | ........................ | 363/1 |
| 4,479,175 A * | 10/1984 | Gille et al. | ...................... | 363/41 |
| 5,959,410 A * | 9/1999 | Yamauchi et al. | ........ | 315/209 R |
| 6,441,564 B1 * | 8/2002 | Gu et al. | ........................ | 315/291 |
| 6,535,399 B2 * | 3/2003 | Gu | ................................ | 363/17 |
| 6,738,275 B1 * | 5/2004 | Beland | ............................ | 363/71 |
| 7,221,107 B2 * | 5/2007 | Melis | ............................ | 315/291 |
| 7,291,993 B2 * | 11/2007 | Bai et al. | ........................ | 315/307 |
| 7,333,348 B2 * | 2/2008 | Horiuchi et al. | ................ | 363/16 |
| 7,548,435 B2 * | 6/2009 | Mao | ................................ | 363/16 |
| 2005/0057190 A1 * | 3/2005 | Fujiwara et al. | ............... | 315/291 |
| 2005/0099827 A1 * | 5/2005 | Sase et al. | ........................ | 363/16 |
| 2009/0021175 A1 * | 1/2009 | Wendt et al. | ............... | 315/200 R |
| 2009/0034299 A1 * | 2/2009 | Lev | ................................ | 363/17 |

* cited by examiner

*Primary Examiner* — Adolf Berhane
*Assistant Examiner* — Fred E Finch, III
(74) *Attorney, Agent, or Firm* — Francis T. Coppa

(57) ABSTRACT

A high voltage, high speed, and high repetition rate pulse generator solves the high pulse repetition rate limitations associated with RF power amplifiers. The pulse generator employs resonant techniques to provide current limiting features that allow for continued high voltage, high speed, and high repetition pulse rate operation of the pulse generator without impairment of the pulse generator during both short circuit and open circuit load conditions.

23 Claims, 4 Drawing Sheets

HIGH VOLTAGE, HIGH SPEED, HIGH PULSE REPETITION RATE PULSE GENERATOR

BACKGROUND

The invention relates generally to electronic power conversion and more particularly to a high voltage, high speed, high pulse repetition rate pulse generator using soft switching and pulse shaping technologies.

Generators capable of operating at high voltages, high speeds, and high pulse repetition rates have generally employed radio frequency (RF) power amplifiers and related technology to accomplish high voltage, high speed and high pulse repetition rate generation and transmission. Such RF power amplifiers are expensive to produce and suffer in reliability due to internal heat build-up during high pulse repetition rate generation. RF amplifiers also undesirably require significant real estate and generally have low electric efficiency. Further, RF power amplifier technology is not particularly suitable for generation of high pulse repetition rates due to thermal losses, among other things.

It would be both advantageous and beneficial to provide a high voltage, high speed, high pulse repetition rate pulse generator that solves the high pulse repetition rate limitations associated with RF power amplifiers. It would be further advantageous if the high voltage, high speed, high pulse repetition rate pulse generator were capable of continued operation without impairment of the pulse generator during both short circuit and open circuit load conditions.

BRIEF DESCRIPTION

Briefly, in accordance with one embodiment, a pulse generator for generating high voltage, high speed, high repetition rate pulses is provided. The pulse generator comprises:

an inverter configured to convert a DC voltage to a high frequency AC voltage;

a converter configured to operate as an AC current source in response to the AC voltage; and a voltage shaping portion configured to generate a high voltage, high speed, high repetition rate voltage pulse in response to an AC input current generated by the AC current source.

According to another embodiment, a method of generating a high voltage, high speed, high repetition rate voltage pulse comprises:

converting a DC voltage to a high frequency AC voltage;

generating an AC current in response to the AC voltage; and generating a high voltage, high speed, high repetition rate voltage pulse in response to the AC current.

According to yet another embodiment, a pulse generator comprises:

means for converting a DC voltage to a high frequency AC voltage;

means for generating an AC current in response to the AC voltage; and means for generating a high voltage, high speed, high repetition rate voltage pulse in response to the AC current.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
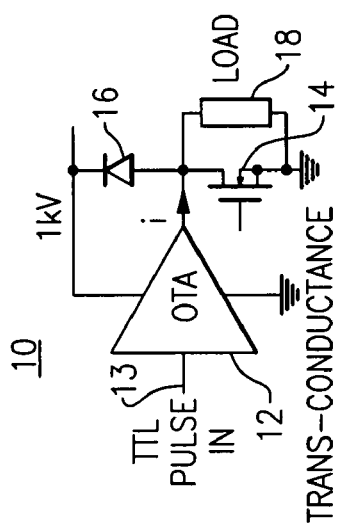
FIG. 1 is a simplified circuit diagram illustrating a soft switching, pulse shaping generator according to one embodiment.
Figure 2:
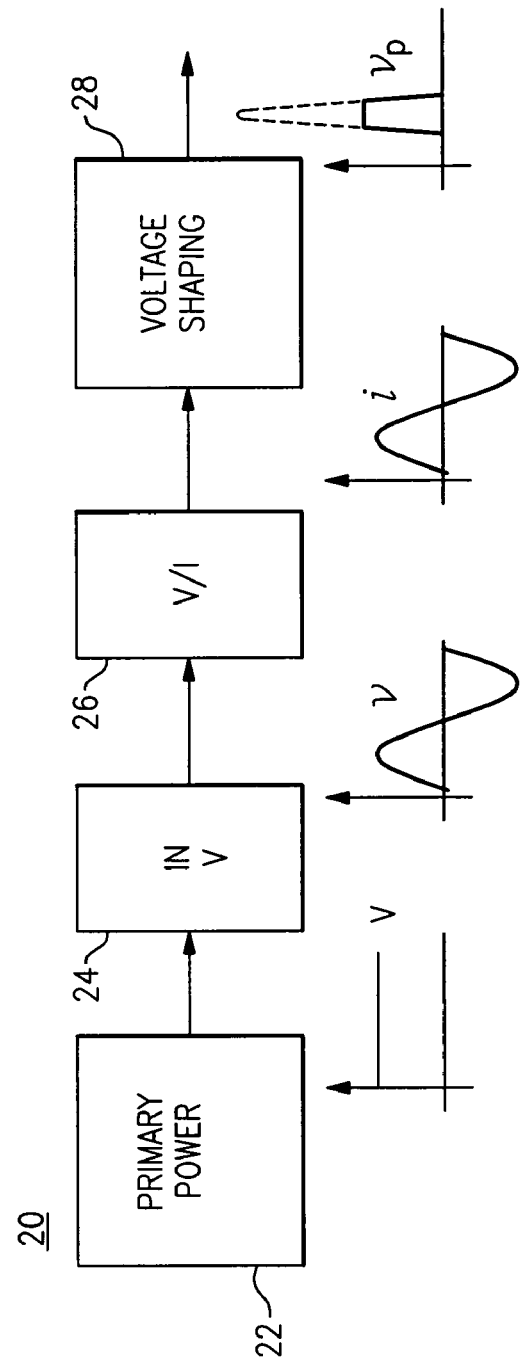
FIG. 2 is a flowchart illustrating exemplary steps of a method for generating a high voltage, high speed, high repetition rate voltage pulse according to one embodiment.

FIGS. 1 and 2 are first described to provide a background helpful to better understanding the discussion associated with FIG. 3 that is described below. Looking now at FIG. 1, a simplified circuit diagram illustrates a basic soft switching, pulse shaping circuit architecture 10 according to one embodiment. Circuit 10 includes a trans-conductance amplifier 12 that functions as a current source in response to an input voltage pulse 13.

A MOSFET device 14 in combination with a clamping diode 16 operate together as a pulse shaping circuit to generate a square or rectangular shaped voltage pulse across a desired load 18. Circuit 10 is robust against short circuit and open circuit loads due to the current source that drives the pulse shaping circuit.

The gate input drive of MOSFET device 14 is controlled in a manner that allows the MOSFET device 14 to turn on in a soft switching mode. Soft switching reduces switching losses associated with the MOSFET switching device 14 as the switching frequency is increased. The combination of soft switching and pulse shaping allows the circuit 10 to operate as a high voltage, high speed, high repetition rate pulse generator that is robust against both open circuit and short circuit loading.

FIG. 2 is a flowchart 20 illustrating exemplary steps of a method for generating a high voltage, high speed, high repetition rate voltage pulse according to one embodiment. The method commences by providing a primary DC input voltage, as represented in block 22. The DC input voltage is then passed through an inverter to generate a high frequency (e.g. 25 MHz) AC voltage, as represented in block 24. The AC voltage is converted into a current source to generate AC current, as represented in block 26. The current source allows the pulse generator to function in a robust manner by providing a means of current limiting that is not achievable when using a pure voltage source to drive a dynamic load 18 such as depicted in FIG. 1. The AC current then drives a voltage shaping circuit to generate a square or rectangular output voltage pulse, as represented in block 28.

Figure 3:
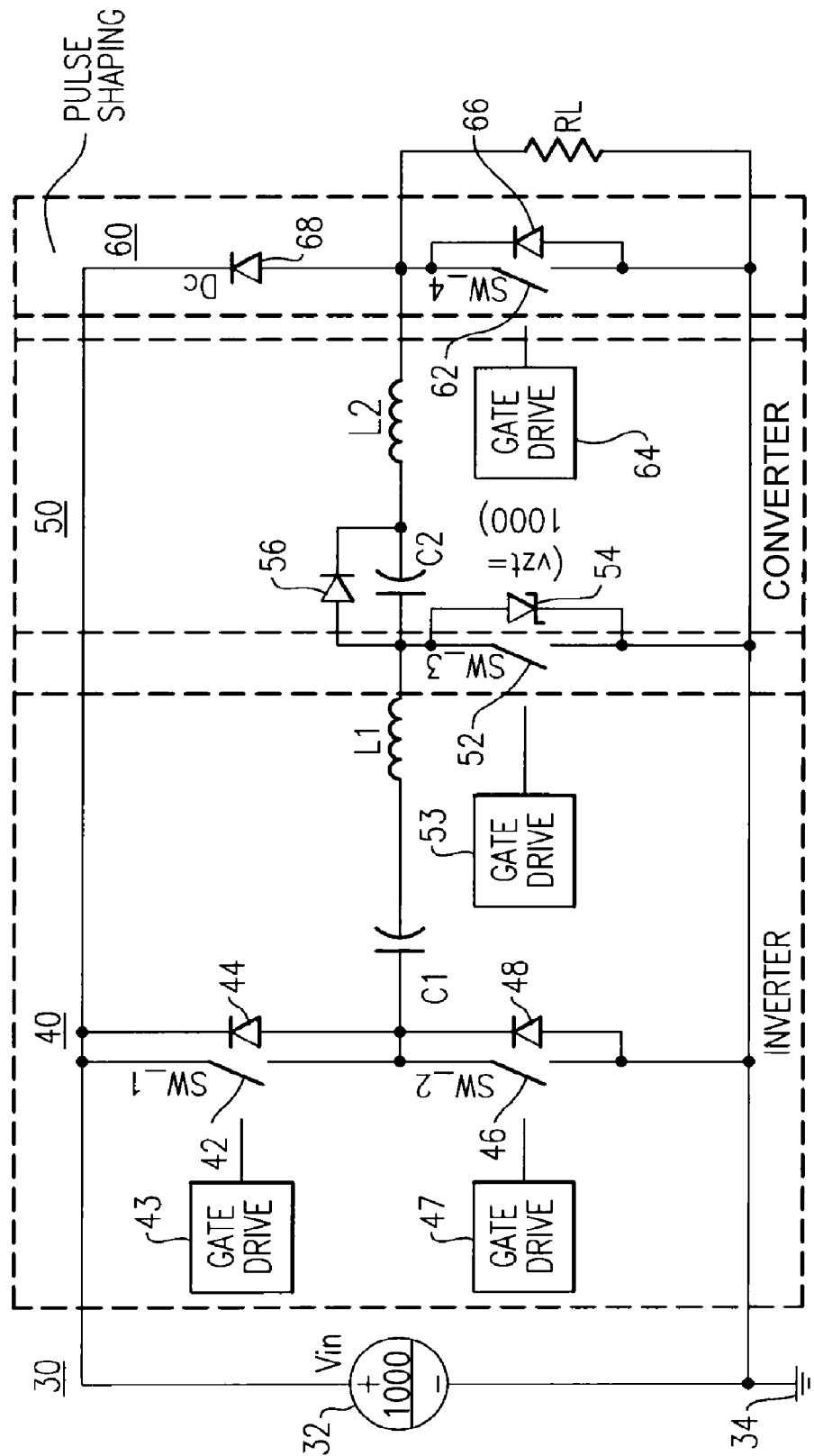
FIG. 3 is a circuit diagram illustrating in more detail, a soft switching, pulse shaping generator according to one embodiment.

FIG. 3 is a circuit diagram illustrating in more detail, a soft switching, pulse shaping generator 30 according to one embodiment. The circuit architecture of generator 30 allows the generator 30 to generate a high voltage, high speed, and high repetition rate voltage output pulse.

Generator 30 can be seen to include an inverter 40, a converter 50 and a pulse shaping portion 60. The inverter 40 includes a first tank circuit including capacitor C1 and inductor L1 that together have a natural resonant frequency. The inverter 40 also includes an upper soft switch 42 connected at one end to a positive DC voltage source 32 and connected at its opposite end to capacitor C1 as shown in FIG. 3. Upper soft switch 42 operates in a soft switching mode via a gate drive element 43 to control the on-off switching operation. The clamping diode 44 that limits the voltage across the lower switch 46 could be a parasitic body diode of the switch 42. Inverter 40 further includes a lower soft switch 46 connected at one end to a generator ground 34 and connected at its opposite end to capacitor C1 as also shown in FIG. 3. Lower soft switch 46 operates in a soft switching mode via a corresponding gate drive element 47 to control the on-off switching operation. The clamping diode 48 that limits the voltage across the upper switch 42 could be a parasitic body diode of the switch 46. Upper soft switch 42 and lower soft switch 46 are configured such that upper soft switch 42 is turned on when lower soft switch 46 is turned off and vice versa. Each switch 42, 46 operates according to one embodiment, in a soft switching mode at a high frequency rate that is equal to or higher than the natural resonant frequency of the tank circuit formed by capacitor C1 and inductor L1, such as, for example, 25 MHz.

The converter 50 can be seen to also have a tank circuit (second tank circuit) including capacitor C2 and inductor L2. The first tank circuit of the inverter 40 and the second tank circuit of the converter 50, in one embodiment, are configured such that the resonant frequency of C1 and L1 together have the same resonant frequency as a combination tank circuit including C1 combined with C2 and L1 combined with L2. This configuration allows substantially all of the energy stored in the first tank circuit including capacitor C1 and inductor L1 to be transferred to the second tank circuit including capacitor C2 and inductor L2 during the switching process. This configuration also allows for current doubling such that the peak current flowing through inductor L2 is substantially twice the peak current flowing through inductor L1 during the switching process. Third switch 52 operates, according to one embodiment, in a soft switching mode via gate drive 53 and in combination with diode 54, diode 56 and the second tank circuit including capacitor C2 and inductor L2 to generate an AC current through inductor L2. The diode 54 could be a parasitic body diode of switch 52 although a Zener diode is preferred. The load, RL in FIG. 3, then receives its power from the energy that is stored by inductor L2 and is isolated from the DC voltage source by the inverter 40 and converter 50. This isolation feature advantageously allows the generator 30 to drive a dynamic load that can change between a short circuit and an open circuit and can include driving a dynamic load during steady state operation in a region ranging anywhere between the short circuit and open circuit conditions.

Generator 30 further includes a pulse shaping portion 60 that is configured to efficiently drive a dynamically changing load and also to generate a square wave or rectangular voltage pulse in response to the energy flowing through inductor L2. Pulse shaping portion includes a soft switch 62 and operates in a soft switching mode via gate drive element 64. Soft switch 62 functions in combination with diode 66 and diode 68 to generate a square or rectangular voltage pulse during the switching process. The foregoing resonant frequency switching process advantageously provides pure voltage switching at high frequencies (MHz range) in the presence of dynamically changing load conditions.

Figure 4:
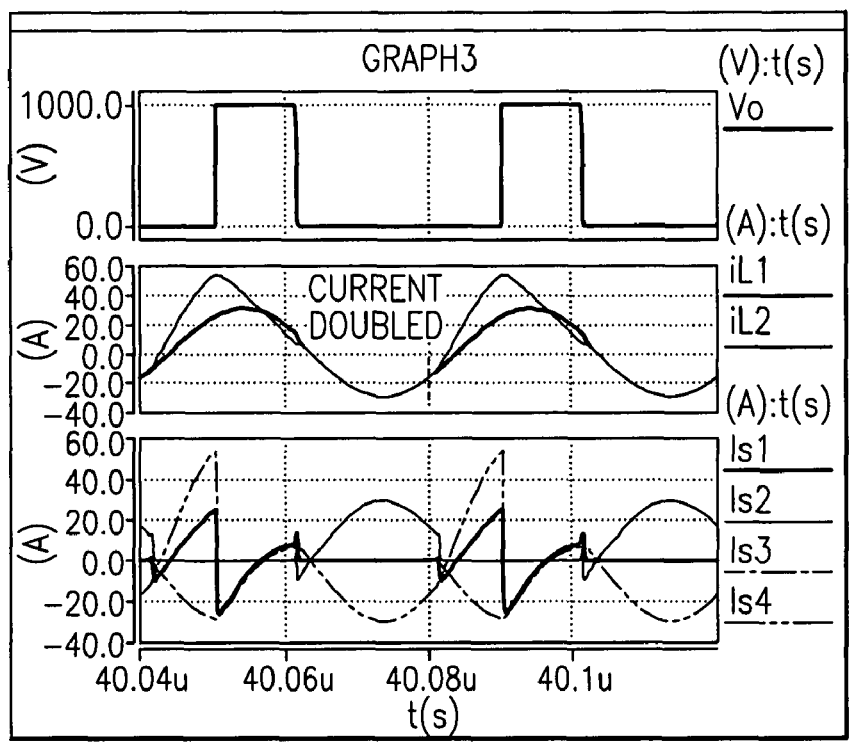
FIG. 4 is a set of waveforms illustrating operating circuit voltages and currents during steady state operation of the generator shown in FIG. 3, according to one embodiment.

FIG. 4 is a set of waveforms illustrating operating circuit voltages and currents during steady state operation of the generator 30 shown in FIG. 3, according to one embodiment. The top waveform illustrates a high voltage (approximately 1000 volts), high frequency (MHz range), and high repetition rate output voltage pulse generated by the generator 30. The middle waveform illustrates the peak current doubling achieved by the generator 30. The bottom waveform illustrates the AC current flowing through the inverter, converter and pulse shaping switches during normal steady state operation of the pulse generator 30.

Figure 5:
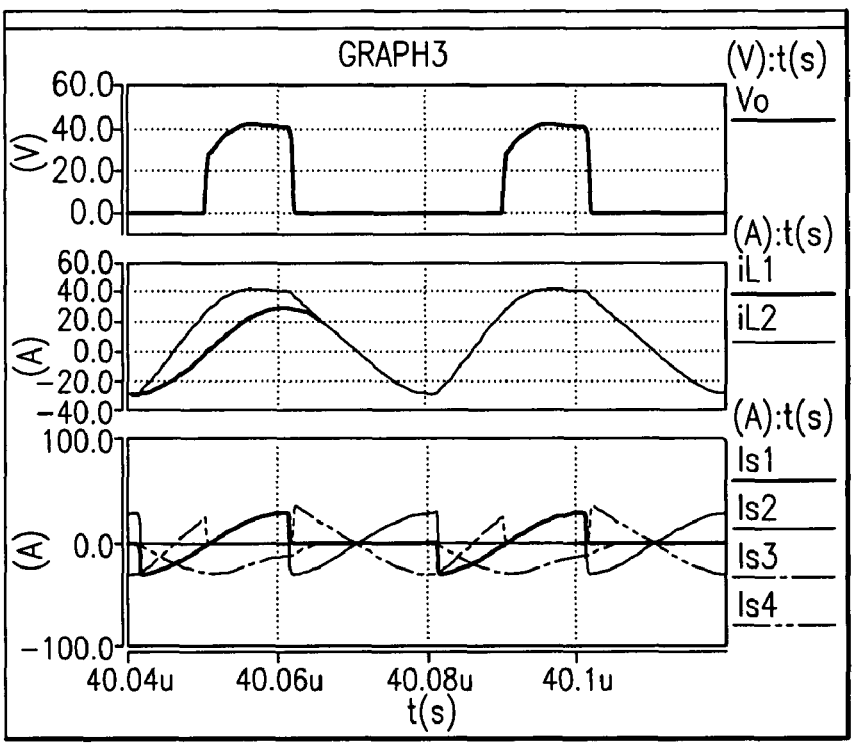
FIG. 5 is a set of waveforms illustrating operating circuit voltages and currents during short circuit load conditions for the generator shown in FIG. 3, according to one embodiment.

FIG. 5 is a set of waveforms illustrating operating circuit voltages and currents during short circuit load conditions for the generator 30 shown in FIG. 3, according to one embodiment. The short circuit operating waveforms illustrate the operational capabilities of the pulse generator 30, even during short circuit loading at the output. The waveforms demonstrate the pulse generator 30 continues to operate without any adverse effects due to the current limiting features.

Figure 6:
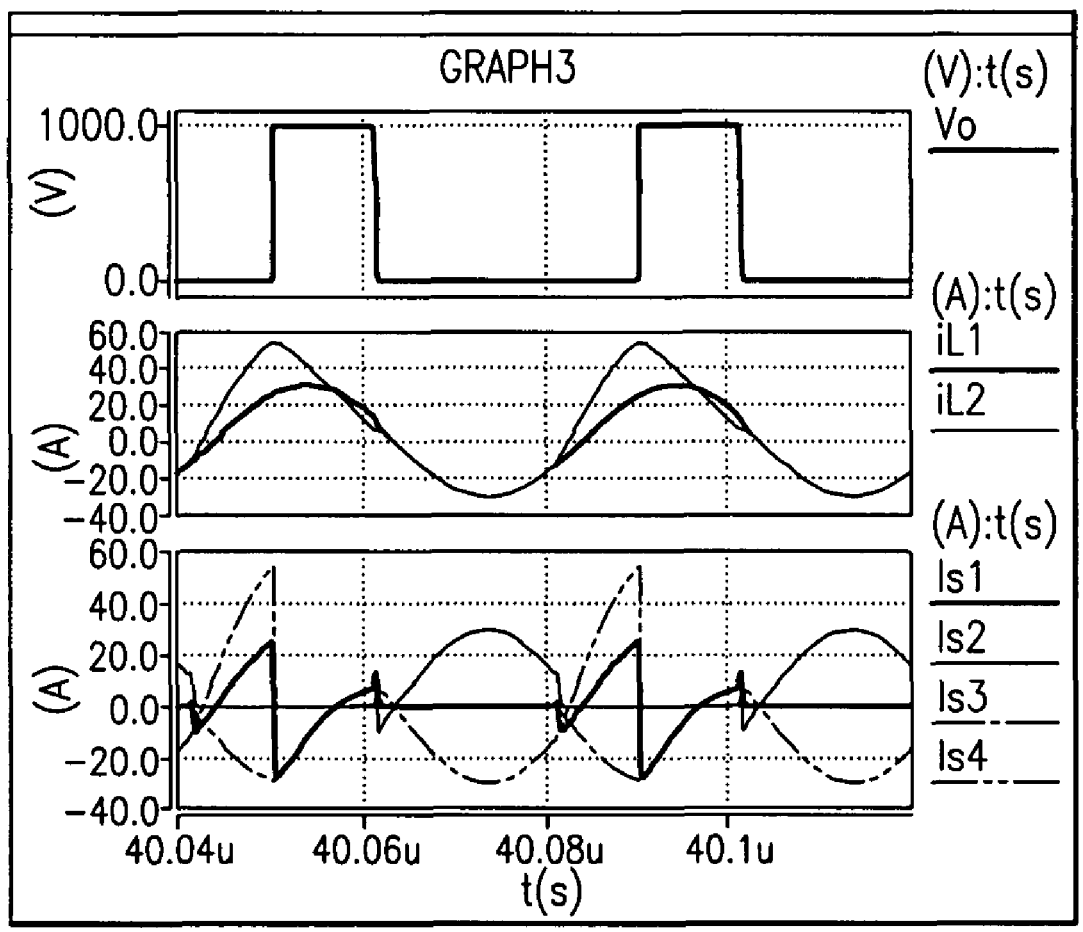
FIG. 6 is a set of waveforms illustrating operating circuit voltages and currents during open circuit load conditions for the generator shown in FIG. 3, according to one embodiment.

FIG. 6 is a set of waveforms illustrating operating circuit voltages and currents during open circuit load conditions for the generator 30 shown in FIG. 3, according to one embodiment. The open circuit operating waveforms illustrate the operational capabilities of the pulse generator 30, even during open circuit loading at the generator output. The waveforms demonstrate the pulse generator 30 continues to operate, even during open circuit loading without any adverse effects due to the current limiting features.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A pulse generator comprising:
   an inverter configured to convert a DC voltage to a high frequency AC voltage;
   a converter comprising a series output inductor and configured to operate as an AC current source to a load connected directly to the converter series output inductor in response to the AC voltage; and
   a voltage shaping portion connected in parallel with and directly to both the current source and the load and configured to generate a high voltage, high speed, high repetition rate voltage pulse across the load in response to an AC input current generated by the converter configured to operate as an AC current source, wherein the inverter, converter and voltage shaping portion together continue to generate a high speed, high repetition rate voltage pulse across the load during changing load conditions ranging between substantially short circuit load conditions and open circuit load conditions, wherein the frequency of the high speed, high repetition rate voltage pulse across the load is identical to the frequency of the AC input current.

2. The pulse generator according to claim 1, wherein the inverter comprises a pair of high voltage switches, each switch configured to operate in a soft switching mode in combination with a corresponding clamping diode to generate the high frequency AC voltage.

3. The pulse generator according to claim 2, wherein each high voltage switch is driven via a corresponding gate drive element such that each high voltage switch operates in a soft switching mode.

4. The pulse generator according to claim 1, wherein the converter comprises a high voltage switch configured to operate in a soft switching mode in combination with a corresponding clamping diode to generate the AC input current.

5. The pulse generator according to claim 4, wherein the converter high voltage switch is driven via a corresponding gate drive element such that the converter high voltage switch operates in a soft switching mode.

6. The pulse generator according to claim 1, wherein the pulse shaping portion comprises a high voltage switch configured to operate in a soft switching mode in combination with a corresponding clamping diode to generate the high voltage, high speed, high repetition rate voltage pulse.

7. The pulse generator according to claim 6, wherein the pulse shaping portion high voltage switch is driven via a corresponding gate drive element such that the pulse shaping portion high voltage switch operates in a soft switching mode.

8. The pulse generator according to claim 1, wherein the inverter and converter each comprises an LC tank circuit, the tank circuits together configured to transfer substantially all the energy stored in the inverter tank circuit to the converter tank circuit during inverter and converter switching modes.

9. The pulse generator according to claim 1, wherein the inverter and the converter each comprise an LC tank circuit inductor, the tank circuits together configured such that the peak current flowing through the converter tank circuit inductor is substantially twice the peak current flowing through the inverter tank circuit inductor.

10. The pulse generator according to claim 1, wherein the pulse shaping portion is configured to generate a square or rectangular high voltage, high speed, high repetition rate voltage pulse in response to the AC input current generated by the converter configured to operate as the AC current source.

11. A method of generating a high voltage, high speed, and high repetition rate voltage pulse, the method comprising:
converting a DC voltage to a high frequency AC voltage via an inverter;
generating an AC current in response to the AC voltage via a converter comprising a series output inductor and configured to operate as an AC current source in response to the AC voltage; and
generating an unfiltered high voltage, high speed, and high repetition rate voltage pulse across a load at the AC current frequency in response to the AC current via a voltage shaper, wherein the inverter, converter and voltage shaper together continue to generate a high speed, high repetition rate voltage pulse at the AC current frequency across the load during changing load conditions ranging between substantially short circuit load conditions and open circuit load conditions such that the frequency of the high speed, high repetition rate voltage pulse across the load is identical to the frequency of the AC current generated via the AC current source.

12. The method of claim 11, wherein converting a DC voltage to a high frequency AC voltage comprises controlling a pair of inverter high voltage switches to operate in a soft switching mode via corresponding gate drive elements to generate the high frequency AC voltage.

13. The method of claim 11, wherein generating an AC current in response to the AC voltage comprises controlling a converter high voltage switch to operate in a soft switching mode via a corresponding gate drive element to generate the AC current.

14. The method of claim 13, wherein generating an AC current in response to the AC voltage further comprises transferring substantially all the energy stored in an inverter tank circuit to a converter tank circuit during inverter and converter switching modes.

15. The method of claim 14, wherein generating an AC current in response to the AC voltage further comprises transferring substantially all the energy stored in an inverter tank circuit to a converter tank circuit such that the peak current flowing through the converter tank circuit is substantially twice the peak current flowing through the inverter tank circuit during the inverter and converter switching modes.

16. The method of claim 11, wherein generating a high voltage, high speed, and high repetition rate voltage pulse in response to the AC current comprises controlling a pulse shaping high voltage switch to operate in a soft switching mode via a corresponding gate drive element to generate the high voltage, high speed, high repetition rate voltage pulse.

17. The method of claim 11, wherein generating a high voltage, high speed, and high repetition rate voltage pulse in response to the AC current comprises generating a square or rectangular high voltage, high speed, high repetition rate voltage pulse in response to an AC input current generated by a converter configured to operate as an AC current source.

18. A pulse generator comprising:
means for converting a DC voltage to a high frequency AC voltage;
means comprising a series output inductor for generating an AC current in response to the AC voltage; and
means for generating an unfiltered high voltage, high speed, and high repetition rate voltage pulse at the AC current frequency across a load in response to the AC current, wherein the means for converting, means for generating an AC current and means for generating a high voltage, high speed, and high repetition rate voltage pulse together continue to generate a high speed, high repetition rate voltage pulse at the AC current frequency across the load during changing load conditions ranging between substantially short circuit load conditions and open circuit load conditions such that the frequency of the high speed, high repetition rate voltage pulse across the load is identical to the frequency of the AC current generated via the means for generating the AC current.

19. The pulse generator according to claim 18, wherein the means for converting a DC voltage to a high frequency AC voltage comprises a pair of high voltage switches, each switch configured to operate via a corresponding gate drive element in a soft switching mode, in combination with a corresponding clamping diode to generate the high frequency AC voltage.

20. The pulse generator according to claim 18, wherein the means for generating an AC current in response to the AC voltage comprises a high voltage switch configured to operate via a corresponding gate drive element in a soft switching mode, in combination with a corresponding clamping diode to generate the AC input current.

21. The pulse generator according to claim 18, wherein the means for generating a high voltage, high speed, and high repetition rate voltage pulse in response to the AC current comprises a high voltage switch configured to operate via a corresponding gate drive element in a soft switching mode, in combination with a corresponding clamping diode to generate the high voltage, high speed, high repetition rate voltage pulse.

22. The pulse generator according to claim 18, wherein the means for converting a DC voltage to a high frequency AC voltage and the means for generating an AC current in response to the AC voltage each comprises an LC tank circuit, the tank circuits together configured to transfer substantially all the energy stored in the converting means tank circuit to the generating means tank circuit during conversion of the DC voltage to the AC current.

23. The pulse generator according to claim 18, wherein the means for converting a DC voltage to a high frequency AC voltage and the means for generating an AC current in response to the AC voltage each comprises an LC tank circuit, the tank circuits together configured such that the peak current flowing through the converting means tank circuit is substantially twice the peak current flowing through the generating means tank circuit during conversion of the DC voltage to the AC current.

\* \* \* \* \*